SEMICONDUCTOR HETEROJUNCTION DIODE

Filed March 25, 1966

INVENTORS
EVERETT D. HINKLEY
ROBERT H. REDIKER
DALE K. JADUS

BY. Robert T. Dunn

ATTORNEY 3,486,949
Patented Dec. 30, 1969

3,486,949
SEMICONDUCTOR HETEROJUNCTION DIODE

Robert H. Rediker, Newton, and Everett D. Hinkley, West Concord, Mass., and Dale K. Jadus, Cambridge Springs, Pa., assignors to Massachusetts Institute of Technology, Cambridge, Mass., a corporation of Massachusetts Filed Mar. 25, 1966, Ser. No. 537,335
Int. Cl. H01l 3/00
U.S. Cl. 148—33.4 15 Claims

ABSTRACT OF THE DISCLOSURE

A single crystal heterojunction diode is formed between two different semiconductor materials, one having a wider band gap than the other, joined together by crystalline structure formed of atoms of each of the materials and in which the ratio of the wider band gap to the narrower band gap and the crystalline lattice mismatch are sufficiently large that in operation the voltage drop across the narrow band gap material is a negligible fraction of the voltage drop across the diode. The diode can operate at high speed and exhibits characteristics similar to a metal-semiconductor Schottky barrier diode.

This invention relates to single crystal heterojunction structures, and more particularly to a diode structure which exhibits characteristics of the Schottky barrier varactor diode.

The Schottky theory is applicable to a metal-semiconductor contact and explains some of the characteristics of such a contact. In accordance with Schottky barrier theory, an electrical barrier layer is formed at the metal-semiconductor interface. Consider for example a contact between a metal and an n-type semiconductor. When contact is made, electron flow frequently occurs from the semiconductor to the metal, either because of the smaller work function of the semiconductor or the effects of interface states. As a consequence, the metal will acquire a negative surface charge and the semiconductor will charge positively adjacent to the interface. Actually, the positive charge in the semiconductor consists of ionized donors, which of course are fixed in space and thus create a space charge within the semiconductor rather than on the surface, as on the metal. This space charge is called the barrier layer and is of determinable thickness. It was observed that an externally applied voltage will change the potential across the barrier and will change the thickness of the barrier and the thickness of the barrier directly determines its capacitance. Thus, the capacitance of the contact can be varied by varying the voltage applied across the contact. It is this characteristic of the Schottky barrier metal-semiconductor contact that is employed in the well-known varactor diode.

Heretofore, such metal-semiconductor varactor diodes have been operated at microwave frequencies. For this purpose, the upper cutoff frequency of the varactor must be sufficiently high to include the frequency of operation. The upper cutoff frequency varies inversely as the product of the diode series resistance and the diode capacitance. Accordingly, in order to extend the upper frequency limit of the varactor, it is necessary that the product of series resistance and capacitance be maintained very small. Heretofore, this has been accomplished by making the junction area as small as possible and employing a very thin piece of semiconductor.

It is one object of the present invention to provide a varactor diode which exhibits Schottky barrier behavior and which can be fabricated without incurring some of the difficulties encountered in fabricating the well known metal-semiconductor Schottky barrier type varactor.

It is another object of the present invention to provide a single crystal junction which exhibits Schottky barrier type behavior, so that the junction can be employed as a varactor.

It is another object of the present invention to provide such a single crystal junction varactor which can be employed at microwave frequencies.

It is another object of the present invention to provide a diode for high speed operation capable of switching times comparable to or less than the metal-semiconductor junction.

It is another object of the present invention to provide a single crystal heterojunction such that junction capacitance varies substantially with applied voltage.

It is another object of the present invention to provide a single crystal heterojunction having a graded energy gap region of finite depth at the junction interface.

In accordance with a principal feature of the present invention, a single crystal heterojunction is formed by, for example, an interface alloying technique, such as described in application Ser. No. 404,818, by Rediker, entitled "Interface Alloy Epitaxial Heterojunction," now U.S. Patent No. 3,351,502. The junction is formed between two semiconductor bodies having substantially different energy gaps. With suitable choice of materials, the heterojunction can perform, electrically, in a manner similar to a Schottky barrier metal-semiconductor contact. The lower energy gap semiconductor plays a role similar to the metal in the Schottky barrier junction and the higher energy gap semiconductor material plays a role similar to the semiconductor material in the Schottky barrier juncion. Such a single crystal junction between different semiconductor materials can be formed very rapidly (in a few seconds) under more controllable conditions than the metal-semiconductor contact, and results in greater uniformity in production of the junctions, thus enabling relatively close tolerances to be held in production.

The present invention contemplates a single crystal heterojunction formed of a variety of combinations of semiconductor materials, employing bulk or epitaxial semiconductor materials with threaded feature that the band gap of one of the semiconductor materials is substantially greater than the band gap of the other. As a result, the forward and reverse current characteristics of the junction are similar to Schottky barrier type emission.

In accordance with an additional feature of the invention, the lower band gap semiconductor material is selected so that it contributes negligible series resistance to the junction. When the series resistance is small and the junction area is sufficiently small that its capacitance is low, the product of series resistance and capacitance is low, permitting use of the junction at high microwave frequencies and in high speed switching circuits. Operation in high speed switching circuits is further enhanced when both of the semiconductor materials are n-type or p-type, as this eliminates minority carrier recombination effects such as normally occur in p-n junctions.

In accordance with another feature of the invention, the lower energy gap semiconductor material may be sufficiently heavily doped so that essentially none of the applied voltage is developed across this material. In this case, the lower energy gap semiconductor material is selected and/or doped so that the relative positions of the edges of the bands define degenerate conditions; that is the Fermi level is above the lower limit of the conduction band. In this degenerate case, the lower energy gap semiconductor material exhibits characteristics more like a metal, especially at cryogenic temperatures where carrier freezeout can occur for non-degenerate material.

Other features and objects of the present invention will be apparent from the following specific description taken in junction with the figures in which.

Figure 1:
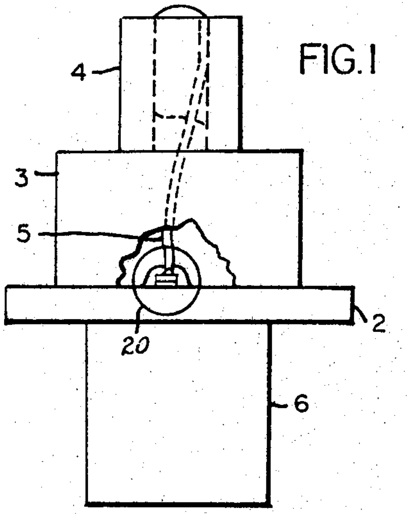
FIG. 1 illustrates the single crystal heterojunction varactor incorporating features of the invention and mounted in a microwave package.

FIG. 1 illustrates the configuration of a single crystal heterojunction varactor 1 carried by an electrically conductive plate 2 of, for example, copper and enclosed by an envelope 3 of dielectrical material which fixes securely and seals to the copper plate 2. A contact housing cylinder 4 extends from the envelope 3 and provides a useful electrical contact via silver wire 5 to the junction. A stub 6 extends from the other side of the plate 2 and is useful to manipulate the package and secure it in a microwave system, such as a strip transmission line or waveguide, so that the microwave energy propagates through the envelope 3 and exchanges energy with the junction circuit. The overall dimensions of such a structure may measure no more than 5 to 6 millimeters, and even this dimension is quite large compared to the dimensions of the junction 1.

Figure 2:
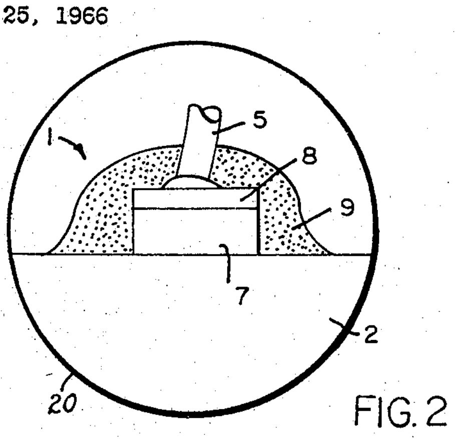
FIG. 2 is an enlarged view showing a single crystal heterojunction fabricated from bulk semiconductor material.

The particular junction illustrated in FIG. 1 and enclosed in a circle 20 and shown enlarged in FIG. 2 is a bulk type single crystal heterojunction of GaAs-InSb. The InSb has a substantially smaller band gap than the GaAs and so it is inclined to exhibit the characteristics of a metal to a greater degree than the GaAs. The initial interface alloying process to form the junction makes use of relatively large wafers of GaAs and InSb. For example, the initial InSb wafer may have a diameter of approximately 1.2 mm., and is formed by, for example, placing the lower melting temperature semiconductor material on the higher melting temperature material and heating the semiconductor couple from the bottom until alloying is acocmplished at the interface. This process is described in the above mentioned U.S. Patent No. 3,351,502. Thereafter, the relatively large single crystal heterojunction is broken up into small chips. Those having junction dimensions of less than 100 microns are employed. Such a junction chip is illustrated in FIG. 2. The GaAs side 7 of the chip 1 is alloyed to the conductive plate 2 and a 50 micron diameter silver wire 5 approximately 5 mm., long is soldered to the InSb side 8 of the semiconductor. The heterojunction is then etched, in order to clean it up and reduce the cross sectional area of the junction; after which it is encapsulated in a suitable epoxy 9. The microwave envelope 3 is then slipped over the wire which is soldered to the metallic contact 4, so that electrical contact can be made to the semiconductor via the contact 4 and wire 7.

Figure 3:
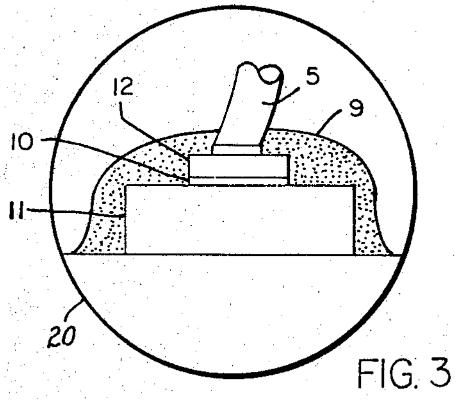
FIG. 3 is an enlarged view showing a single crystal heterojunction formed with epitaxial semiconductor material.

A single crystal heterojunction, shown in FIG. 3, can be formed by growing the lower band gap semiconductor from a thin epitaxial film 10 of the relatively wide band gap material which has been deposited on a substrate 11 of the same wide band gap semiconductor material of suitable resistivity using the techniques described in the above mentioned application. For example, a thin epitaxial film of relatively pure GaAs is formed on a substrate of low resistivity GaAs, in order to reduce both series resistance and junction capacitance.

Techniques for establishing the single crystal heterojunction capacitance and series resistance for both the bulk and epitaxial types of junctions described above and some of the effects of capacitance and resistance are discussed below.

The combination of GaAs and InSb for the single crystal heterojunction varactor is particularly suitable because the energy gap for InSb is approximately 0.18 ev. at room temperature while the energy gap for GaAs is 1.38 ev. or about 8 times as large. The allowing techniques described in the above-mentioned U.S. Patent No. 3,351,502 permits formation of a single crystal junction of these two semiconductor materials, in spite of the very large lattice mismatch (14%) between the two. The fabrication may be controlled so that there is a graded gap region at the interface over which the energy gap converges from 1.38 ev. to 0.18 ev., as will be shown. The depth, $l$, of the graded gap region, shown in the energy gap profile in FIG. 4 can be controlled by, for example, varying the alloying time when the junction is made, thereby to control barrier height without substantially altering the junction capacitance. The doping in this graded gap region can be controlled by, for example, varying the nature and concentration of impurities in the InSb, thereby to vary the effective diffusion voltage, $V_D$, which directly determines junction capacitance.

The reproducibility and control in the formation of such a single crystal heterojunction are readily within the state of the art and so the junction can be formed with considerable reliability to meet relatively narrow specifications. Such is not the case with the metal-semiconductor contacts employed heretofor as varactors.

Figure 4:
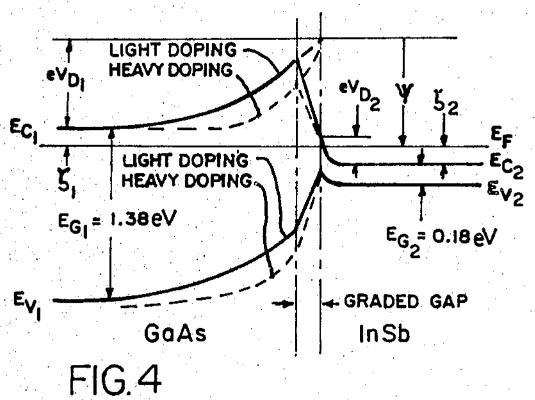
FIG. 4 is an energy band profile of a single crystal heterojunction as an aid to understanding operation of the device.

FIG. 4 is an energy band profile of the GaAs and InSb n-n heterojunction. The GaAs characteristics are denoted by the subscript 1 and the InSb characteristics are denoted by the subscript 2. The subscrip $v$ denotes the upper limit of the valence band and the subscript $c$ denotes the lower limit of the conduction band. $V_D$ is the diffusion voltage for each of the semiconductor materials, $\psi$ is the work function, $\zeta$ is the gap between lower limit of the conduction band and the Fermi level (denoted $E_F$) and $l$ is the length of the graded-gap region. The gap $\zeta$ for each of the semiconductors is of course determined by the bulk impurity concentration in each. More particularly, $\zeta = kTln(n/N_c)$ (for non-degenerate material) where $k$ is the Boltzman constant, T is temperature, $n$ is electron concentration and $N_c$ is density of states in the conduction band of the semiconductor material. However, even though $\zeta$ is varied, the interfacial band configuration is invariant, since the large lattice mismatch between the two semiconductor materials produces many states in the forbidden gaps at the interface therebetween. These interfacial states fix the relative positions of the band edges with respect to the Fermi level $E_F$. Thus, the work function $\psi$ of the junction remains fixed and is essentially independent of bulk impurity concentrations in either of the semiconductors. The depth of the barrier, on the other hand, is determined by the degree of doping of the wide-gap semiconductor material. Thus, the degree of doping, as well as the dimensions of the junction, determine the capacitance of the junction at zero voltage.

Figure 5:
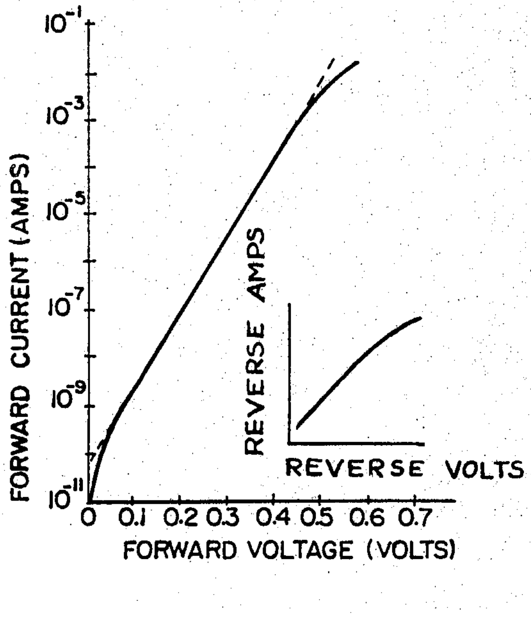
FIG. 5 shows plots of current voltage curves for forward current and reverse current operation of a typical junction.

The current-voltage characteristics of the GaAs, InSb, n-n heterojunction No. A–1 are shown in FIG. 5. The rectification ratio is 3 times $10^4$ and 1 times $10^8$ at 0.25 and 0.5 volt respectively, with a reverse breakdown of over 30 volts. This clearly shows useful rectification. As shown and demonstrated herein, features of the present invention provide a diode capable of operation at very high speed (high frequency) by virtue of low junction capacitance, low series resistance and the avoidance of minority carrier recombination effects, such as normally occur in p-n junctions. For example, switching time of less than a nanosecond can be obtained.

The current-voltage characteristics in FIG. 5 also reveals the Schottky barrier type behavior of the junction. As shown in FIG. 5, the log of the forward current versus voltage is substantially linear over most of the range, with current varying as exp $(qV/\eta kT)$. For this example, $\eta=1.02$ and, thus, the characteristics closely resemble pure Schottky emission for which $\eta$ is unity. It should be noted that the characteristics differ markedly, from that of a single crystal GaAs p-n homojunction where $\eta$ is invariably 2 or greater.

Diode theory as developed by Bethe and modified by Courant to take into account the effects of image forces and tunneling, and/or the presence of a graded-gap region, predicts a current-voltage relationship of the form $$J=A^*T^2e^{-\psi/\eta kT}(e^{qV/\eta kT}-1)$$

In this realtionship, J is the curernt density, A* is the effective Richardson constant, $\psi$ is the effective metal-to-semiconductor barrier, T is absolute temperature, $k$ is the Boltzmann constant, $q$ is the electron charge, and V is the potential applied across the junction. The modification factor $\eta$ is usually somewhat greater than unity because of image force effects, tunneling, and/or the presence of the graded-gap region at the interface. According to Bethe, the factor $\eta$ is equal to unity in the absence of these effects.

Values of $\psi$ can be calculated employing the current density equation above, and these values are plotted in the table below for a number of different GaAc–InSb n-n single crystal heterojunctions denoted A1, and 2, B1 and 2, C1 and 2, and D1 and 2 in the table. The junctions in the table designated with an * were fabricated with undoped InSb for which $\eta=1.8\times10^{16}$ cm.$^{-3}$. The other junctions were fabricated with InSb having an electron concentration of $1\times10^{18}$ cm.$^{-3}$.

| Junction No. | $(N_d-N_a)$, GaAs(cm.$^{-3}$) From Hall effect | From capacitance | $\psi$(eV), $qV_d$(eV) from 1–V data | from capacitance | $\eta$ |
|---|---|---|---|---|---|
| A-1 | $3.9\times10^{15}$ | $3.8\times10^{15}$ | 0.84 | 0.86 | 1.02 |
| A-2* | $3.9\times10^{15}$ | $3.5\times10^{15}$ | 0.88 | 0.80 | 1.01 |
| B-1 | $1.3\times10^{16}$ | $1.2\times10^{16}$ | 0.80 | 0.73 | 1.05 |
| B-2* | $1.3\times10^{16}$ | $4.4\times10^{16}$ | 0.82 | 0.76 | 1.02 |
| C-1 | $1.5\times10^{17}$ | $2.0\times10^{17}$ | 0.80 | 0.83 | 1.10 |
| C-2* | $1.5\times10^{17}$ | $1.9\times10^{17}$ | 0.85 | 0.90 | 1.11 |
| D-1 | $8.4\times10^{17}$ | $8.6\times10^{17}$ | 0.80 | 0.94 | 1.17 |
| D-2* | $8.4\times10^{17}$ | $5.1\times10^{17}$ | 0.84 | 0.98 | 1.17 |

The table includes the calculation of $N_d-N_a$ in the GaAs depletion region for each junction from capacitance data; and Hall values are included for comparison. ($N_d$ is the donor concentration in the GaAs and $N_a$ is acceptor concentration in the GaAs.)

The table also includes values of $\psi$ for each of the junctions calculated employing the current-voltage equation and the forward current characteristics of the junction, such as illustrated in FIG. 5. The value of $\psi$ in each case is clearly independent of the GaAs bulk and purity concentration over the range of concentrations employed. Thus, the Fermi level at the interface is determined by interface states, as has been predicted; and this is obtained experimentally. In addition, the tabulated values of $\psi$ are consistent with the barrier heights determined by others (such as Mead and Spitzer) for metallic contacts to n-type GaAs.

The table also contains the values of $\eta$ for the various heterojunction couples, and as can be seen, $\eta$ clearly increases for junctions fabricated from more heavily doped GaAs, in which the narrow depletion layer enhances tunneling and image force effects, just as suggested by the Courant modification of Schottky emission and by the effects of the graded gap.

Measurements of the junction capacitance as a function of the applied voltage for all eight of the junctions listed in the table above reveal that in each case, the capacitance varies as $V^{-1/2}$. As can be seen from the table, the carrier concentration in the GaAs computed from the measured capacitance is for each junction in substantial agreement with the measured coefficient.

The microwave cutoff frequency, $f_c$, of a heterojunction varactor at an external bias voltage V is given by $$f_c(V)=\frac{1}{2\pi R_sC(V)}$$

where $R_s$ is the total resistance between the terminals of the device, and C(V) the junction capacitance. C(V) and $R_s$ are further defined as follows:

$$C(V)=A\frac{q\epsilon(N_d-N_a)^{1/2}}{2(V_d-V)}\quad R_s=R_{h.g.}+R_{l.g.}$$

where A is the junction area, $q(N_d-N_a)$ is the net charge density in the depletion region, $V_d$ the dffusion potential, and $\epsilon$ is the static dielectric constant of the higher-energy-gap semiconductor $R_{h.g.}$ and $R_{l.g.}$ are the series resistance contributions of the higher-gap and lower-gap semiconductors, respectively, and are both equal to $\rho t/A$ (where $\rho$ is the resistivity of the semiconductor and $t$ is the semiconductor thickness). The resistance offered by the lead wire 5 in FIGS. 1, 2, and 3 is not considered here, as it can usually be made negligibly small. $R_{l.g.}$ may be reduced by using low-resistivity material for the lower-energy-gap semiconductor; that is, more heavily doped n-type material may be used to reduce $R_{l.g.}$. Attempts to use a similar technique to reduce $R_{h.g.}$, however, would be countered by an increase in C(V), as shown by the equation given above.

$R_{h.g.}$ can be reduced without increasing C(V) by using the epitaxial type single crystal heterojunction shown in FIG. 3. In this case very low series resistance of the thin epitaxial film ($t$ is but a few microns) on a relatively heavily doped substrate 11 insures low series resistance and at the same time, because of the purity (low $N_d$) of the film, insures low junction capacitance.

The various embodiments of the invention described herein include n-type GaAs and n-type InSb. However, it should be understood that p-type InSb can be employed, in which case the series resistance of the junction will tend to be higher and this will tend to reduce the upper cutoff frequency, $f_c$, of the junction for reasons already given. Also, p-type GaAs can be employed in place of the n-type GaAs, in which case the barrier height will be lower. This is sometimes an advantage. Again, however, the series resistance of the junction will be higher. Furthermore, combinations of other semiconductor materials not mentioned herein can be used and selected to provide a junction having the desired barrier height, capacitance, series resistance and graded-gap and ultimately cutoff frequency and switching time. These other combinations can be selected in accordance with the various features of the present invention disclosed herein.

This completes description of a number of embodiments of the present invention of a single crystal heterojunction diode which exhibits electrical characteristics similar to those of a metal-semiconductor Schottky barrier and/or is capable of high speed operation. In the embodiment described, the junction is formed at the interface of two different semiconductors, preferably selected so that the band gap of one of the semiconductors is substantially greater than the band gap of the other. In embodiments which exhibit the characteristics of a varactor the impurity level in the lower band gap semiconductor material is preferably sufficiently high so that the material behaves analogous to the metal in the metal-semiconductor Schottky barrier. Furthermore, doping and/or thickness of the relatively wide gap semiconductor material is selected to produce the desired junction resistance and capacitance.

In other embodiments, a graded energy gap is provided at the junction interface and is doped to establish junction capacitance. This embodiment formed with semiconductor materials of the same type (both p- or both n-type) is capable of relatively high speed operation. These and other features of the invention, however, are made only by way of example and are not intended to limit the invention as set forth in the accompanying claims.

What is claimed is:

1. A single crystal heterojunction diode comprising at least two different semiconductor materials joined together by crystalline structure formed of atoms of each of the semiconductor materials, the band gap of one of said semiconductor materials being substantially wider than the band gap of the other, and the narrower band gap material having an impurity concentration sufficiently high that the Fermi level is above the lower limit of the conduction band of the narrow band gap material.

2. A junction as in claim 1 and in which, the ratio of the band gap of the relatively wide band gap semiconductor material to the band gap of the relatively narrow band gap semiconductor material is sufficiently high, and the wider band gap materail has a sufficiently low impurity concentration that the junction performs usefully as a varactor.

3. A junction as in claim 1 and in which, the impurity concentration in said relatively narrow band gap semiconductor material is sufficiently high so that said junction exhibits current voltage characteristics similar to the metal-semiconductor Schottky barrier.

4. A junction as in claim 1 and in which, both the semiconductor materials are the same conductivity type.

5. A junction as in claim 1 and in which, said relatively wide band gap semiconductor material is GaAs and said relatively narrow band gap material is InSb.

6. A junction as in claim 1 and in which, said relatively wide band gap semiconductor material is n-type GaAs and said relatively narrow band gap semiconductor material is n-type InSb.

7. A junction as in claim 1, formed by interface alloy technique of n-type GaAs and n-type InSb, the thickness of the GaAs material being such that junction resistance is small enough and the impurity concentration in the GaAs being such that said junction capacitance is small enough that the upper operating cutoff frequency of the junction is in the microwave region.

8. A junction as in claim 7 and in which, said GaAs material is an epitaxial layer formed on a thicker layer of the GaAs.

9. A junction as in claim 1 and which, contains a graded-energy gap region at said joining crystalline structure.

10. A single crystal heterojunction diode as in claim 1 and in which, the impurity concentration in the narrower band gap material is sufficiently high that the narower band gap material is degenerate at the operating temperature of the heterojunction.

11. A single crystal heterojunction diode as in claim 1 and in which, the wider gap material has a relatively low impurity level and is relatively thin, whereby junction resistance and capacitance are relatively low and upper cutoff frequency of the heterojunction is relatively high.

12. A single crystal heterojunction diode as in claim 10 and in which, the wider band gap material is an epitaxial layer and is formed on a substrate of relatively low resistivity semiconductor material of the same conductivity type as the wider band gap material, and the narrower band gap material is grown on the epitaxial layer of wider band gap material.

13. A single crystal heterojunction diode as in claim 11 and in which, the semiconductor materials are of the same conductivity type.

14. In a single crystal heterojunction diode formed by an epitaxial layer of relatively wide band gap semiconductor material joined to a semiconductor material of relatively narrow band gap, the combination comprising:

a relatively high junction barrier and relatively low junction resistance for the materials selected, which are obtained by the relatively low concentration of impurities in the wide band gap material, and relatively high concentration of impurities in the narrow band gap material.

15. A single crystal heterojunction diode as in claim 14 and in which, the concentration of impurities in the narrower band gap material is sufficiently high that the narrower band gap material is degenerate at the operating temperature of the heterojunction.

References Cited

UNITED STATES PATENTS

| | | | |
|---|---|---|---|
| 3,118,794 | 11/1964 | Pfann | 148—33.1 |
| 3,129,343 | 4/1964 | Logan. | |
| 3,132,057 | 5/1964 | Greenberg | 148—33.4 X |
| 3,209,215 | 9/1965 | Esaki | 143—33.4 X |
| 3,234,057 | 2/1968 | Anderson | 148—33 |
| 3,351,502 | 11/1967 | Rediker | 148—33.4 X |
| 3,208,888 | 9/1965 | Ziegler et al. | 148—174 |

OTHER REFERENCES

Anderson, R. L. Experiments on Ge–GaAs Heterojunctions. In Solid State Electronics. 5: pp. 341–51, 1962.

L. DWAYNE RUTLEDGE, Primary Examiner

R. A. LESTER, Assistant Examiner

U.S. Cl. X.R.

148—33, 33.1; 317—234, 235